United States Patent
Zhang et al.

(10) Patent No.: US 10,414,141 B2
(45) Date of Patent: Sep. 17, 2019

(54) METHOD FOR TRANSFERRING NANOMATERIALS

(71) Applicants: Tsinghua University, Beijing (CN); HON HAI PRECISION INDUSTRY CO., LTD., New Taipei (TW)

(72) Inventors: Li-Na Zhang, Beijing (CN); Xiao-Rui Zhang, Beijing (CN); Xiao-Hua Gu, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 95 days.

(21) Appl. No.: 15/715,267

(22) Filed: Sep. 26, 2017

(65) Prior Publication Data
US 2018/0207922 A1 Jul. 26, 2018

(30) Foreign Application Priority Data
Jan. 20, 2017 (CN) .......................... 2017 1 0051758

(51) Int. Cl.
| | | |
|---|---|---|
| B32B 37/00 | (2006.01) | |
| B05D 1/02 | (2006.01) | |
| B05D 1/28 | (2006.01) | |
| C01B 32/194 | (2017.01) | |
| B81C 3/00 | (2006.01) | |
| B32B 38/10 | (2006.01) | |
| B82Y 40/00 | (2011.01) | |

(52) U.S. Cl.
CPC .............. *B32B 37/025* (2013.01); *B05D 1/02* (2013.01); *B05D 1/28* (2013.01); *B81C 3/008* (2013.01); *C01B 32/194* (2017.08); *B05D 1/286* (2013.01); *B32B 38/10* (2013.01); *B81B 2203/0127* (2013.01); *B81C 2201/0195* (2013.01); *B82Y 40/00* (2013.01); *Y10S 977/892* (2013.01)

(58) Field of Classification Search
CPC .. B05D 1/02; B05D 1/28; B05D 1/286; B32B 37/025; B32B 38/10; B81C 1/00; B82Y 40/00; C01B 32/00; Y10S 977/892
See application file for complete search history.

(56) References Cited

PUBLICATIONS

BiOX (X = Cl, Br, I) nanostructures: Mannitol-mediated microwave synthesis, visible light photocatalytic performance, and Cr(VI) removal capacity; Guangfang et al. (Year: 2013).*
Growth of graphene from solid carbon sources; Zhengzong et al. (Year: 2010).*

* cited by examiner

*Primary Examiner* — Sonya M Sengupta
(74) *Attorney, Agent, or Firm* — ScienBiziP, P.C.

(57) ABSTRACT

A method of transferring nanomaterials with sugar, the method including: depositing a colloidal sugar layer on a first substrate; pressing a second substrate and a nanomaterial layer located on the second substrate on the colloidal sugar layer, wherein the nanomaterial layer is adhered to the colloidal sugar layer; solidifying the colloidal sugar layer into a solid sugar layer; tearing the second substrate; locating a fourth substrate on the nanomaterial layer; placing the first substrate, the solid sugar layer, the nanomaterial layer and the fourth substrate in a solvent, wherein the solid sugar layer is dissolved in the solvent, and the nanomaterial layer is detached from the first substrate and attached to the fourth substrate.

10 Claims, 4 Drawing Sheets

METHOD FOR TRANSFERRING NANOMATERIALS

CROSS-REFERENCE TO RELATED APPLICATIONS

This application claims all benefits accruing under 35 U.S.C. § 119 from China Patent Application No. 201710051758.1, filed on Jan. 20, 2017, in the China Intellectual Property Office, the disclosure of which is incorporated herein by reference.

FIELD

The subject matter herein generally relates to a method for transferring nanomaterials.

BACKGROUND

Nanomaterials such as graphene and molybdenum sulfide have become a hotspot in chemistry, material science and physics because of their excellent properties. At present, large-scale preparation and transfer are still major issues in the study of nanomaterials. For example, in the prior art, graphene can be prepared by mechanical stripping method, silicon carbide epitaxial growth method, oxidation reduction method, chemical vapor deposition (CVD) and the like. The CVD method for making graphene can be widely used wherein the graphene made by CVD can be uniform, large area, high quality and layer controllable.

Presently, the method for transferring graphene from a copper substrate to other substrates comprises: providing a support material such as polymethylmethacrylate (PMMA) or thermal release tape; etching the copper substrate; transferring the graphene and the support material to a target substrate; removing the support material. But the support material such as PMMA or thermal release tape is not easily removed, and residual organic binders would seriously pollute the graphene. That can affect performance characterization and device preparation.

What is needed, therefore, is to provide a method for transferring nanomaterials for solving the problem discussed above.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views. Implementations of the present technology will now be described, by way of example only, with reference to the attached figures, wherein.

DETAILED DESCRIPTION

Figure 1:
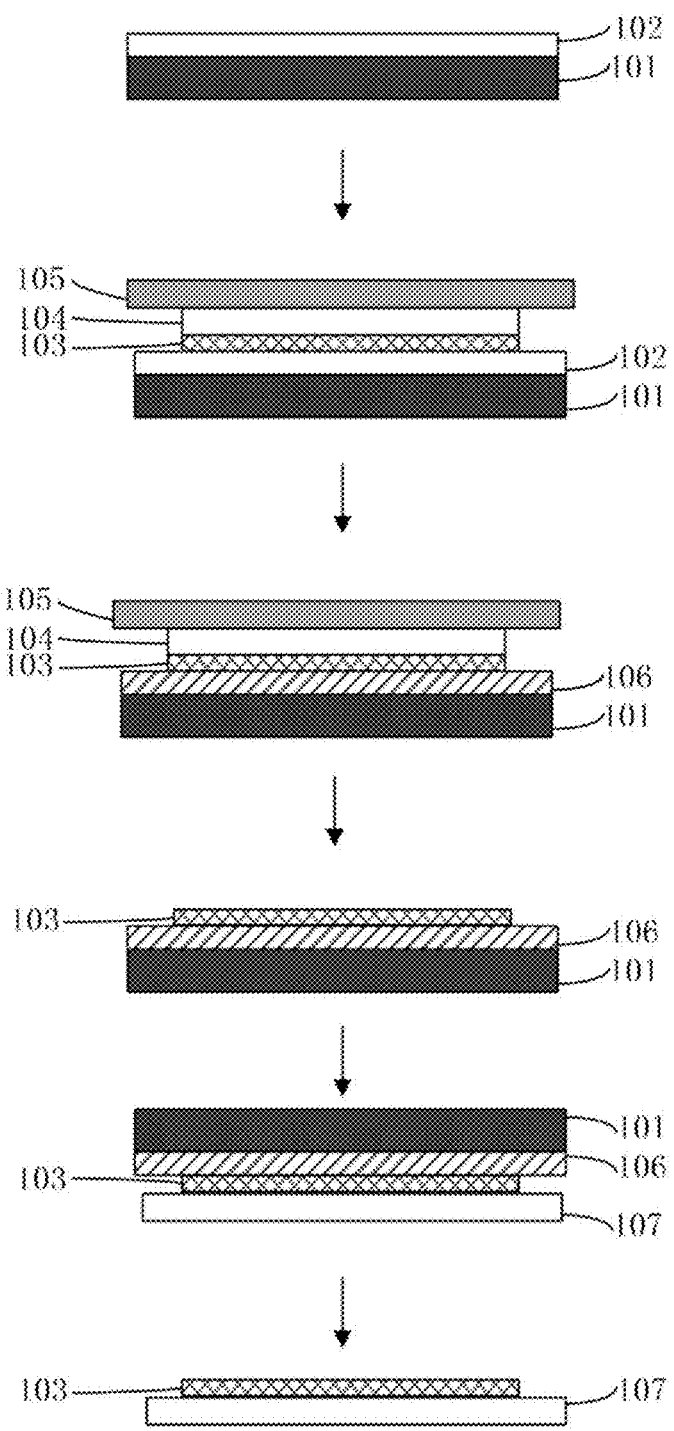
FIG. 1 is a flow chart of one embodiment of a method for transferring nanomaterials.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated to better illustrate details and features. The description is not to be considered as limiting the scope of the embodiments described herein.

Several definitions that apply throughout this disclosure will now be presented.

The connection can be such that the objects are permanently connected or releasably connected. The term "substantially" is defined to be essentially conforming to the particular dimension, shape or other word that substantially modifies, such that the component need not be exact. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

Referring to FIG. 1, an embodiment of a method of transferring nanomaterials with sugar comprises:

S11, applying a colloidal sugar layer 102 on a first substrate 101;

S12, pressing a second substrate 104 and a nanomaterial layer 103 located on the second substrate 104 on the colloidal sugar layer 102, wherein the nanomaterial layer 103 adheres to the colloidal sugar layer 102;

S13, solidifying the colloidal sugar layer 102 into a solid sugar layer 106;

S14, removing the second substrate 104 from the nanomaterial layer 103;

S15, locating a fourth substrate 107 on the nanomaterial layer 103;

S16, placing the first substrate 101, the solid sugar layer 106, the nanomaterial layer 103 and the fourth substrate 107 in water, wherein the solid sugar layer 106 is dissolved in water, and the nanomaterial layer 103 is detached from the first substrate 101 and attached to the fourth substrate 107.

In step S11, the method of applying the colloidal sugar layer 102 on the first substrate 101 can be brushing method, scratch coating method, spray method and other methods. The colloidal sugar layer 102 can also be formed by using a needle tube to drop colloidal sugar directly on a surface of the first substrate 101. The amount of sugar can be one drop or more drops, and can be selected according to need.

The first substrate 101 serves as a support. The first substrate 101 can be insulating materials such as silica, silicon nitride. The first substrate 101 can also be conductive materials such as gold, aluminum, nickel, chromium, copper. Also the first substrate 101 can be semiconductor materials such as silicon, gallium nitride, gallium arsenide. In one embodiment, the first substrate 101 is a quartz sheet.

The colloidal sugar material used to make the colloidal sugar layer 102 can be obtained by heating solid sugar such as blocked sugar or granular sugar to a molten state. The colloidal sugar material used to make the colloidal sugar layer 102 can also be obtained by purifying sugar solution. The colloidal sugar layer 102 is pure sugar or sugar with a small amount of water. The colloidal sugar layer 102 is in a colloidal state. The colloidal sugar layer 102 can be adhered to a surface of the nanomaterials and be in full contact with the nanomaterials to transfer the nanomaterials. The material of the colloidal sugar layer 102 can be maltose, glucose, sucrose.

Figure 2:
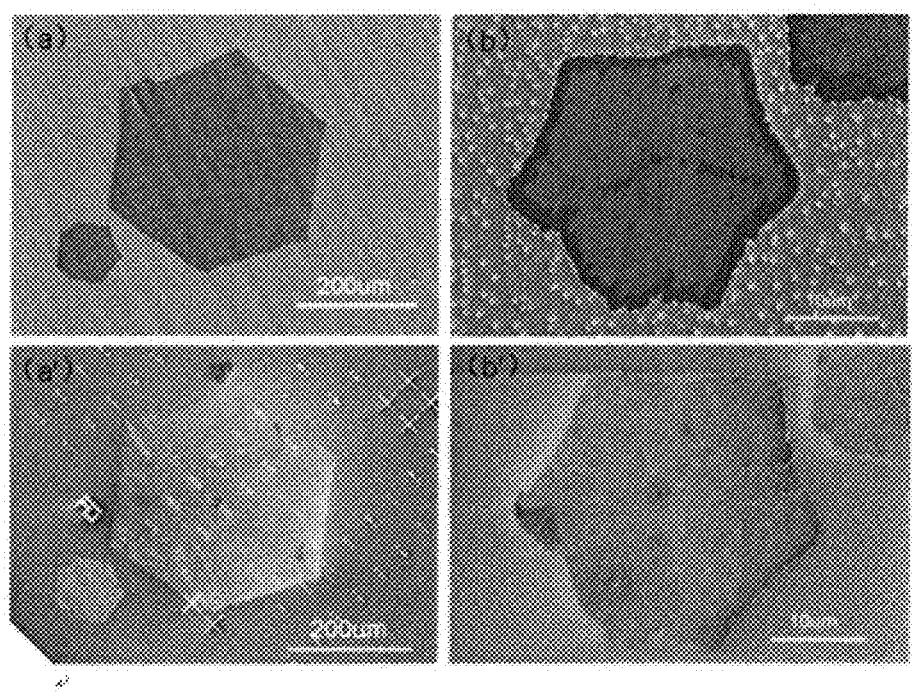
FIG. 2 is a comparison image of before transferring a monolayer graphene and after transferring the monolayer graphene with maltose.

In step S12, the colloidal sugar layer 102 can be in direct contact with the nanomaterial layer 103 and be bond with the nanomaterial layer 103 under a pressure, thus the nanomaterial layer 103 can be completely transferred. Referring to FIG. 2, (a) and (b) are images of monolayer graphene before transferring with maltose; (a') and (b') are images of monolayer graphene after being transferred with maltose. It can be seen that the graphene can be transferred completely with maltose.

The nanomaterial layer 103 is a two dimensional film structure. The thickness of the nanomaterial layer 103 can be in a range from about 0.34 nanometers (nm) to about 100 nm. In one embodiment, the thickness of the nanomaterial layer 103 can be 10 nm, 20 nm, or 50 nm. The material of the nanomaterial layer 103 can be graphene, molybdenum sulfide, or other two dimensional materials. When the material of the nanomaterial layer 103 is graphene, the nanomaterial layer 103 includes at least one graphene sheet. If the nanomaterial layer 103 includes a plurality of graphene sheets, the plurality of graphene sheets can overlap each other to form a large area layer, or stacked with each other to form a large thickness layer. In one embodiment, the nanomaterial layer 103 has a single graphene sheet. The graphene sheet is a one-atom thick planar sheet composed of a plurality of $sp^2$-bonded carbon atoms. The graphene sheet has a high transmittance of 97.7%. A heat capacity of the graphene sheet can be less than $2\times10^{-3}$ $J/cm^2 \cdot K$. In one embodiment, the heat capacity of the graphene sheet is less than $5.57\times10^{-4}$ $J/cm^2 \cdot K$. The graphene sheet can be a free-standing structure. The term "free-standing structure" means that the graphene layer can sustain the weight of itself when it is hoisted by a portion thereof without any significant damage to its structural integrity. So, if the graphene sheet is placed between two separated supports, a portion of the graphene sheet between the two supports, would be suspended between the two supports and yet maintain structural integrity. The nanomaterial layer 103 can be treated with water bath before pressed on the colloidal sugar layer 102. The temperature of water bath is greater than 90 degrees. The time of water bath is in a range from 2 to 5 hours.

The second substrate 104 serves as a support. The second substrate 104 can be metallic materials such as copper, nickel. The second substrate 104 can also be non-metallic materials such as quartz, glass, plastic, adhesive tape. The length, width and thickness of the second substrate 104 are not limited and can be adjusted according to need. A surface of the second substrate 104 can be planar or curved. In one embodiment, the second substrate 104 is a copper substrate with a planar surface, and the nanomaterial layer 103 is graphene sheet grown on the copper substrate directly.

The second substrate 104 and the nanomaterial layer 103 can be pressed on the colloidal sugar layer 102 by the third substrate 105. The third substrate 105 is located on the surface of the second substrate 104 that is spaced from the colloidal sugar layer 102. The pressure on the third substrate 105 can make the second substrate 104 and the nanomaterial layer 103 be uniformly pressed on the colloidal sugar layer 102. The area of the third substrate 105 can be greater than the area of the second substrate 104 and the area of the nanomaterial layer 103, so that the second substrate 104 and the nanomaterial layer 103 can be pressed on the colloidal sugar layer 102 easily and uniformly by using the third substrate 105.

The third substrate 105 material can be rigid materials (e.g., p-type or n-type silicon, quartz, silicon with a silicon dioxide layer formed thereon, crystal, crystal with an oxide layer formed thereon), or flexible materials (e.g., plastic or resin). In one embodiment, the third substrate 105 material is polyethylene terephthalate (PET) wherein there is no viscosity between PET and the solid sugar layer 106. In one embodiment, the third substrate 105 can be replaced by pressure device such as roller. Also pressure can be applied directly to the second substrate 104.

In step S13, after the nanomaterial layer 103 being adhered to the colloidal sugar layer 102, the colloidal sugar layer 102 is solidified into the solid sugar layer 106 by cooling treatment. The cooling treatment can occur by placing the colloidal sugar layer 102 into a cooler having −20 to about 26 degree temperature for a period of time. The solid sugar layer 106 is in a solid state. In one embodiment, the first substrate 101, the colloidal sugar layer 102 and the nanomaterial layer 103 are placed into a refrigerator having −15 degree temperature for 5-10 minutes.

In step S14, since an adhesion force between the solid sugar layer 106 and the nanomaterial layer 103 is greater than an adsorption force between the nanomaterial layer 103 and the second substrate 104, the structure of the nanomaterial layer 103 can not be destroyed when the second substrate 104 is removing by peeling.

In step S15, the fourth substrate 107 is directly attached to the surface of the nanomaterial layer 103. In one embodiment, the fourth substrate 107 is pressed on the surface of the nanomaterial layer 103. The fourth substrate 107 and the nanomaterial layer 103 can be combined by van der Waals attractive force to make the nanomaterial layer 103 being attached on the fourth substrate 107. The fourth substrate 107 can be metallic materials such as copper, nickel. The fourth substrate 107 can also be non-metallic materials such as quartz, glass, plastic, wafers. The length, width and thickness of the fourth substrate 107 are not limited and can be adjusted according to need. A surface of the fourth substrate 107 can be planar or curved. In one embodiment, the fourth substrate 107 is silica.

In step S16, the first substrate 101, the solid sugar layer 106, the nanomaterial layer 103 and the fourth substrate 107 are placed in solvent. Since the sugar can be dissolved in solvent, the solid sugar layer 106 can be completely dissolved in solvent and disappear. In one embodiment, the solvent is water. Since the solid sugar layer 106 is dissolved, the nanomaterial layer 103 is detached from the first substrate 101. The fourth substrate 107 can be in direct contact with the nanomaterial layer 103, thus the nanomaterial layer 103 can be attached to the fourth substrate 107 by van der Waals attractive force. The sugar dissolved in the solvent can be further purified by brewing to form the colloidal sugar. So the sugar can be reused and that saves costs.

Figure 3:
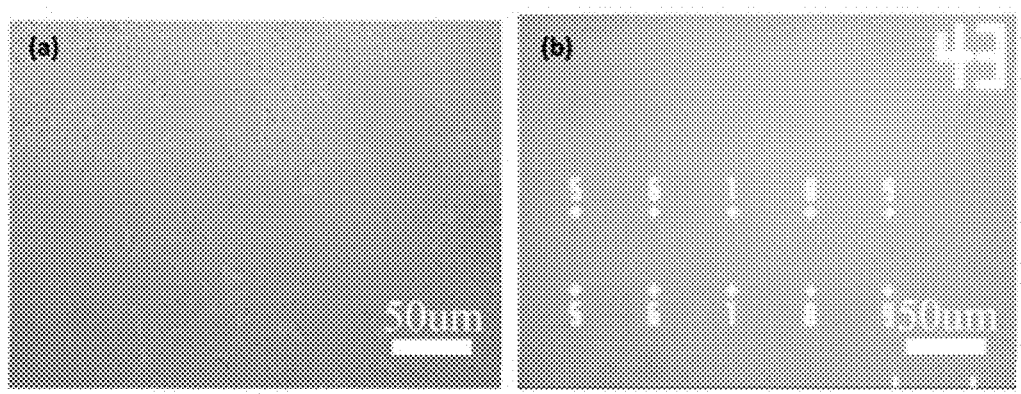
FIG. 3 is Scanning Electron Microscope (SEM) images of a graphene transferred with PMMA and maltose.

Referring to FIG. 3, (a) is the SEM image of graphene transferred with PMMA, it can be seen that there are particles and bright white substance (PMMA) on the graphene, and the particles are residues after etching; (b) is the SEM image of graphene transferred with maltose, it can be seen that the graphene is clean and there is no impurities on the graphene.

Figure 4:
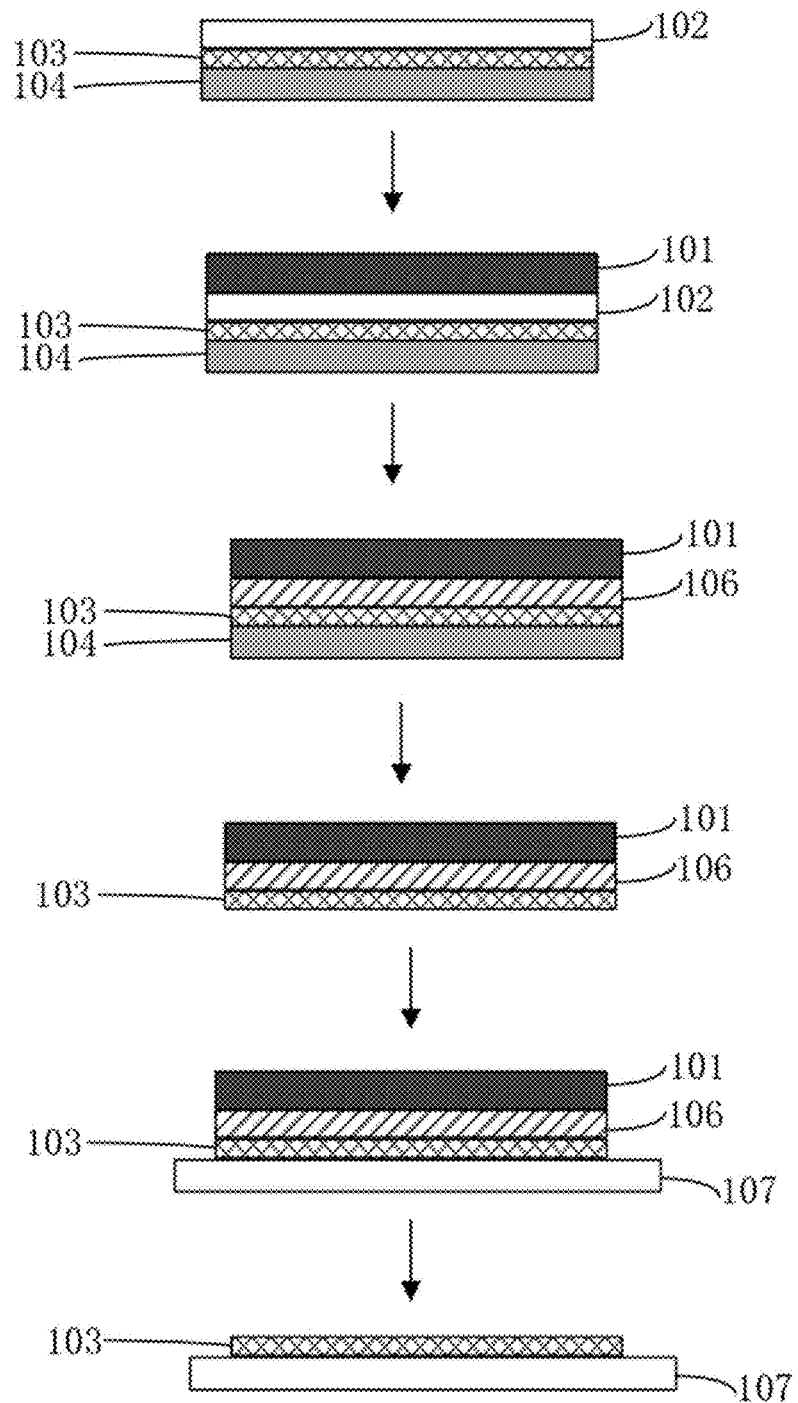
FIG. 4 is a flow chart of one embodiment of a method for transferring nanomaterials.

Referring to FIG. 4, another embodiment of a method of transferring nanomaterials with sugar comprises:

S21, applying a colloidal sugar layer 102 on a nanomaterial layer 103 that is located on a second substrate 104;

S22, pressing a first substrate 101 on the colloidal sugar layer 102;

S23, solidifying the colloidal sugar layer 102 into a solid sugar layer 106;

S24, removing the second substrate 104 from the nanomaterial layer 103;

S25, locating a fourth substrate 107 on the nanomaterial layer 103;

S26, placing the first substrate 101, the solid sugar layer 106, the nanomaterial layer 103 and the fourth substrate 107 in water, wherein the solid sugar layer 106 is dissolved in water, and the nanomaterial layer 103 is detached from the first substrate 101 and attached to the fourth substrate 107.

The method of transferring nanomaterials with sugar is similar with the above method of transferring nanomaterials of FIG. 1 except that the colloidal sugar layer 102 is deposited on and in direct contact with the nanomaterial layer 103 firstly, then the first substrate 101 is pressed on the colloidal sugar layer 102 to make that the nanomaterial layer 103 is adhered to the colloidal sugar layer 102.

The advantages of the method of transferring nanomaterials includes the following points. Since sugar is dissolved in water easily, the graphene transferred by sugar can be very clean. The colloidal sugar can be fully contacted with the nanomaterial layer under certain pressure, so the nanomaterial layer can be completely transferred. Sugar can be dissolved in water and also be environmentally friendly. The nanomaterial layer can be easily transferred onto a curved substrate due to its softness of sugar.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure up to, and including, the full extent established by the broad general meaning of the terms used in the claims.

Depending on the embodiment, certain of the steps of methods described may be removed, others may be added, and the sequence of steps may be altered. The description and the claims drawn to a method may comprise some indication in reference to certain steps. However, the indication used is only to be viewed for identification purposes and not as a suggestion as to an order for the steps.

What is claimed is:

1. A method of transferring nanomaterials, the method comprising:
    applying a colloidal sugar layer on a first substrate;
    placing a second substrate and a nanomaterial layer located on the second substrate on the colloidal sugar layer, wherein the nanomaterial layer is adhered to the colloidal sugar layer;
    solidifying the colloidal sugar layer into a solid sugar layer;
    removing the second substrate;
    locating a third substrate on the nanomaterial layer;
    placing the first substrate, the solid sugar layer, the nanomaterial layer and the third substrate in a solvent, wherein the solid sugar layer is dissolved in the solvent, and the nanomaterial layer is detached from the first substrate and attached to the third substrate.

2. The method as claimed in claim 1, wherein a method of applying the colloidal sugar layer is brushing colloidal sugar material, scratch coating colloidal sugar material, or spraying colloidal sugar material.

3. The method as claimed in claim 2, wherein the colloidal sugar material is obtained by heating solid sugar or purifying sugar solution.

4. The method as claimed in claim 1, wherein the colloidal sugar layer is pure sugar.

5. The method as claimed in claim 1, wherein the colloidal sugar layer comprise a material selected from the group consisting of maltose, glucose, and sucrose.

6. The method as claimed in claim 1, wherein the nanomaterial layer is a two dimensional film structure.

7. The method as claimed in claim 1, wherein the nanomaterial layer comprise a material selected from the group consisting of graphene and molybdenum sulfide.

8. The method as claimed in claim 1, wherein a thickness of the nanomaterial layer is from about 0.34 nm to about 100 nm.

9. The method as claimed in claim 1, wherein the colloidal sugar layer is solidified into a solid sugar layer by placing the colloidal sugar layer into a cooler having −20 to about 26 degree temperature.

10. A method of transferring nanomaterials, the method comprising:
    applying a colloidal sugar layer on a nanomaterial layer located on a second substrate;
    placing a first substrate on the colloidal sugar layer;
    solidifying the colloidal sugar layer into a solid sugar layer;
    removing the second substrate from the nanomaterial layer;
    locating a third substrate on the nanomaterial layer;
    placing the first substrate, the solid sugar layer, the nanomaterial layer and the third substrate in a solvent, wherein the solid sugar layer is dissolved in a solvent, and the nanomaterial layer is detached from the first substrate and attached to the third substrate.

* * * * *